United States Patent
Reber et al.

(10) Patent No.: US 10,790,170 B2
(45) Date of Patent: Sep. 29, 2020

(54) DEVICE AND METHOD FOR CONTINUOUS PRODUCTION OF POROUS SILICON LAYERS

(71) Applicant: FRAUNHOFER-GESELLSCHAFT ZUR FOERDERUNG DER ANGEWANDTEN FORSCHUNG E.V., Munich (DE)

(72) Inventors: Stefan Reber, Gundelfingen (DE); Stefan Lindekugel, Denzlingen (DE); Stefan Janz, Freiburg (DE); Regina Pavlovic, Freiburg (DE)

(73) Assignee: Fraunhofer-Gesellscahft Zur Foerderung Der Angewandten Forschung E.V. (DE)

( * ) Notice: Subject to any disclaimer, the term of this patent is extended or adjusted under 35 U.S.C. 154(b) by 266 days.

(21) Appl. No.: 15/025,362

(22) PCT Filed: Sep. 29, 2014

(86) PCT No.: PCT/EP2014/070804
§ 371 (c)(1),
(2) Date: Mar. 28, 2016

(87) PCT Pub. No.: WO2015/049205
PCT Pub. Date: Apr. 9, 2015

(65) Prior Publication Data
US 2016/0211154 A1    Jul. 21, 2016

(30) Foreign Application Priority Data
Oct. 1, 2013 (DE) .................. 10 2013 219 886

(51) Int. Cl.
*H01L 21/67* (2006.01)
*H01L 21/677* (2006.01)
(Continued)

(52) U.S. Cl.
CPC .......... *H01L 21/67086* (2013.01); *C25F 3/12* (2013.01); *C25F 3/14* (2013.01);
(Continued)

(58) Field of Classification Search
CPC ......... H01L 21/67086; H01L 21/67115; H01L 21/6776; H01L 21/6723; C25F 7/00; C25D 3/14; C25D 3/12
See application file for complete search history.

(56) References Cited

U.S. PATENT DOCUMENTS 5,516,412 A * 5/1996 Andricacos ............ C25D 17/00
204/224 M
5,681,448 A * 10/1997 Uchiyama ................. C25F 3/12
204/224 M
(Continued)

FOREIGN PATENT DOCUMENTS

CN   101796222 A    8/2010
DE   10311893 B3   10/2004
(Continued)

OTHER PUBLICATIONS

Ivanov, Alexey & Sorgenfrei, Ralf & Gust, Elke & Barth, Philipp & Nieuwenhuysen, Kris & Kühnhold-Pospischil, Saskia & Riepe, Stephan & Janz, Stefan. (2018). Optimization of inline processes for the production of freestanding epitaxially grown thin films for solar cells. (Year: 2018).*

(Continued)

*Primary Examiner* — Louis J Rufo
(74) *Attorney, Agent, or Firm* — Gesmer Updegrove LLP

(57) ABSTRACT

The invention relates to a device and a method for continuous production of porous silicon layers (single or multiple layers) on workpieces made of silicon or workpieces with a silicon coating. The method according to the invention is thereby based on a one-sided etching method, the workpiece (Continued)

being guided horizontally, by means of a transport device, with the front side of the workpiece to be etched, past at least one etching chamber, comprising an electrolyte and a cathode. This method can be used in particular for the production of PV cells.

7 Claims, 2 Drawing Sheets

(51) Int. Cl.
      *C25F 3/12*       (2006.01)
      *C25F 3/14*       (2006.01)
      *C25F 7/00*       (2006.01)

(52) U.S. Cl.
      CPC ............ *C25F 7/00* (2013.01); *H01L 21/6723* (2013.01); *H01L 21/6776* (2013.01); *H01L 21/67115* (2013.01)

(56) References Cited

U.S. PATENT DOCUMENTS

| | | | | |
|---|---|---|---|---|
| 6,274,505 | B1 * | 8/2001 | Ito | H01L 21/67086 216/84 |
| 2009/0255820 | A1 * | 10/2009 | Buttard | B81C 1/00126 205/123 |
| 2010/0187068 | A1 * | 7/2010 | Gutekunst | C25D 5/028 198/339.1 |
| 2011/0030610 | A1 | 2/2011 | Kamian | |
| 2011/0120882 | A1 * | 5/2011 | Crafts | H01L 21/67005 205/640 |

FOREIGN PATENT DOCUMENTS

| | | | | |
|---|---|---|---|---|
| DE | 19936569 | B4 | 4/2006 | |
| DE | 10313127 | B4 | 10/2006 | |
| DE | 102005062528 | A1 | 6/2007 | |
| DE | 102006033353 | A1 | 1/2008 | |
| DE | 102008026199 | B3 | 10/2009 | |
| DE | 102008037404 | A1 | 4/2010 | |
| DE | 102009050845 | A1 | 4/2011 | |
| DE | 102013219839 | * | 4/2015 | ......... H01L 21/6776 |
| EP | 0797258 | A2 | 9/1997 | |
| EP | 1059663 | A2 | 12/2000 | |
| EP | 2060659 | A2 | 5/2009 | |
| JP | S6311693 | A | 1/1988 | |
| JP | H-06285719 | A | 10/1994 | |
| JP | H07254729 | A | 10/1995 | |
| JP | H10081998 | A | 10/1999 | |
| JP | 2000349319 | A | 5/2002 | |
| JP | 2003092285 | A * | 3/2003 | |
| JP | 2003092285 | A | 10/2004 | |
| JP | 2008025030 | A | 2/2008 | |
| JP | 2010129630 | A * | 6/2010 | |
| JP | 2010251647 | A | 11/2010 | |
| JP | 2010539324 | A | 3/2011 | |
| JP | 2010129630 | A | 12/2011 | |
| JP | 2012515453 | A | 11/2012 | |
| WO | 02075800 | A1 | 9/2002 | |
| WO | 2010083422 | A1 | 7/2010 | |
| WO | 2011035748 | A1 | 3/2011 | |
| WO | 2011108463 | A1 | 9/2011 | |
| WO | 2011110682 | A2 | 9/2011 | |

OTHER PUBLICATIONS

Office Action issued by the Japanese Patent Office dated Oct. 26, 2017 in related Application No. 2016-519738.
Office Action issued by the Chinese Patent Office dated Dec. 13, 2017 in related Application No. 201480054361.2.
International Search Report dated Dec. 2, 2014 in connection with related International patent application No. PCT/EP2014/070804, 3 pages.
Written Opinion of the International Search Authority dated Sep. 1, 2015 in connection with related International patent application No. PCT/EP2014/070804, 7 pages.
Office Action issued by the German Patent Office dated Aug. 14, 2014 in connection with related German patent application No. 102013219886.8, 7 pages.

* cited by examiner

DEVICE AND METHOD FOR CONTINUOUS PRODUCTION OF POROUS SILICON LAYERS

PRIORITY INFORMATION

The present application is a 371 Application No. PCT/EP2014/070804 filed on Sep. 29, 2014 that claims priority to German Application No. 10 201 3219 886.8 filed on Oct. 1, 2013. Both applications are incorporated herein by reference in their entireties.

The invention relates to a device and a method for continuous production of porous silicon layers (single or multiple layers) on workpieces made of silicon or workpieces with a silicon coating. The method according to the invention is thereby based on a one-sided etching method, the workpiece being guided horizontally, by means of a transport device, with the front-side of the workpiece to be etched past at least one etching chamber, comprising an electrolyte and a cathode. This method can be used in particular for the production of PV cells.

Porous silicon is a material used above all in microsystem technology and is used in the example of sensors. For photovoltaics, porous silicon has been investigated for various applications, for example as a multi-ply layer for Bragg reflectors or as a mechanically weak double-ply layer as nucleation layer for epitaxy processes with subsequent detachment.

The production of a layer made of porous silicon was effected initially by means of currentless etching. In this respect, two different methods are described for example in publications DE 10 2005 062 528 A1 and DE 103 13 127 B4.

In DE 103 13 127 B4, a method is described in which the underside of the wafer is brought in contact with the etching solution, a meniscus is formed. The wafer underside is continuously in contact with the etching solution over the entire process time. In DE 10 2005 062 528 A1, a method is described in which there is no continuous contact between the wafer underside and the etching solution. The etching solution is placed on the wafer underside by a particular profiling of the rotating transport rollers, whilst the wafer is moved progressively horizontally at the same time. On the wafer underside, a liquid film is formed.

By means of the etching reaction, inter alia nitrogen oxides ("$NO_x$" gases) are produced, which are dissolved in part in the etching solution, in part passing into the gas chamber of the process modules. Nitrogen oxides in combination with hydrofluoric acid vapours have an etching effect on silicon, in particular on highly doped silicon, such as the emitter is, and by the HF proportion likewise on phosphosilicate glass or borosilicate glass. In order to avoid undesired (because non-uniform) etching of the emitter side, the reaction vapours are suctioned out of the process chamber or additives are added to the process medium in order to avoid gas formation.

In DE 10 2009 050 845 A1, a method is described in which a defined quantity of water is applied on the wafer on the wafer upper side before the one-sided etching process. The water spreads over the hydrophilic wafer surface (with phospho- or borosilicate glass) and thus forms a layer which protects against the etching vapours.

In DE 10 2008 037 404 A1, a one-sided etching method is described, in which the composition of the gas phase is influenced via the process medium such that the surface is hydrophobised during the edge isolation process or remains hydrophobic after preceding treatment in diluted hydrofluoric acid. Only acidic media are described.

It is likewise possible to use the reaction vapours for intentional emitter back-etching. Such a method is described in WO2011/035748 A1. In order that the emitter side is etched as homogeneously as possible, the reaction vapours are correspondingly suctioned off, or an inert gas is supplied in addition to the gas phase via the process medium or a reactive gas, such as HF or ozone, is supplied in addition. Optionally, an additional etching step, preferably with HF and ozone, is indicated for back-etching of the emitter, as solution or in the gas phase, for improved adjustability of the back-etching process. Uniform controlled back-etching of the emitter is desired because, as a result of removal of highly-doped uppermost emitter layers, the surface recombination of the generated charge carriers is reduced and the efficiency of the solar cells is thus improved. Normally, the edge isolation and the emitter back-etching are implemented in two separate process modules with different etching solutions. The proposed etching media are acidic.

Currentless etching has in recent times been replaced almost entirely by electrochemical etching in an electrolyte comprising hydrofluoric acid and ethanol. In all cases of electrochemical etching, the cathode and the anode are contacted with the two wafer surfaces, which can be effected either directly by a metal-semiconductor contact or indirectly via a metal/graphite-electrolyte-semiconductor contact. A further variant known from the state of the art provides that contacting of one of the two electrodes is effected at the edge of the wafer.

All units suitable for wafer geometries thereby have in common the failing that the wafer cannot be etched over the entire surface or only with great complexity. If the contacting takes place at the edge, for example via a clamp, the contacted region of the wafer must of necessity remain unetched. If however the contacting is effected via the surface, the wafer or the electrolyte contact is provided at least on one side with a sealing ring in order to prevent escape of the electrolyte and also a short circuit. What leads in addition to a reduced throughput is that the toxic electrolyte must be removed in a complex manner before changing the wafer.

It is therefore sought, for a method for the production of porous silicon, that the etched surface is complete on one side without in fact wrap-around on the edge of the wafer. Absolutely essential for application for planar components, such as e.g. solar cells, is an apparatus for this purpose which enables very high throughputs. Process units used in photovoltaics, for e.g. wet-chemical processes, have at present throughputs of some 1,000 wafers per hour.

A further problem resides in the fact that the electrodes used must consist of a noble metal, generally platinum, or ultracompacted carbon (so-called glassy carbon) for reasons of corrosion-protection. Existing units are all designed for planar electrodes since the wafers which are retained in a stationary manner must be etched with as homogeneous an electrical field as possible for reasons of layer homogeneity. For high throughput units, the required quantities of electrode material are a strong cost driver, which can lead to the process being uneconomical.

Stationary methods or ones taking place in rotating containers for the production of porous silicon layers have, as a further challenge, electrical obstruction of the surface to be etched by formed hydrogen bubbles. This problem is normally resolved by strong electrolyte convection or by a vertical process arrangement.

Starting from the problems occurring in the state of the art, it was the object of the present invention to provide a method for whole-surface, one-sided production of porous silicon layers, in which only a negligibly small edge wraparound is effected and no separation of the contact electrodes by sealing rings is required. A further object of the present invention is to produce the scaleability of a corresponding device and to enable simple implementation of multilayer etching processes.

This object is achieved by the device having the features of claim 1 and the method having the features of claim 13. The further dependent claims reveal advantageous developments. In claim 21, uses according to the invention are indicated.

According to the invention, a device for continuous production of porous silicon layers on workpieces made of silicon or workpieces with a silicon coating by means of one-sided etching is provided, which device comprises the following components:
- at least one transport device for continuous transport of the workpiece,
- at least one etching chamber comprising an electrolyte and a cathode which is disposed such that only one surface of the workpiece to be etched can be made wet with the electrolyte, and also,
- an anode which is contacted electrically with the workpiece via a contact unit on a surface not to be etched.

Preferably, the etching chamber is disposed below the workpiece. According to the state of the art, etching chambers have to date always been disposed above the workpiece in order that any bubbles forming can be discharged at the top in order to avoid inhomogeneity during coating. Surprisingly, it was able to be established that, by the sample transport and also partially also by the forced convection of the electrolyte in the etching chamber according to the arrangement according to the invention, depositing of bubbles on the side of the workpiece to be etched was stopped, so that a homogeneous etching is made possible. As a result, the use of an economical etching chamber becomes possible since complex sealing, as in the state of the art, in which the etching chambers are disposed above the workpiece, can be omitted. A further advantage of this variant according to the invention resides in the fact that also discrete workpieces which are transported respectively at a spacing relative to each other, can be machined, whilst only endless workpieces can be used according to the state of the art. A further advantage resides in the fact that this variant according to the invention enables new possibilities with respect to the workpiece geometry. Whilst in an arrangement of the etching chamber above the workpiece, the width of the running belt is specified within narrow limits, the width of the workpieces is very variable in the case of the method according to the invention. A further advantage resides in the fact that, by means of the arrangement of the etching chamber according to the invention below the workpiece, no explicit sealing surfaces are present but, in contrast, a spacing between electrolyte container and the side of the workpiece to be etched can be set. This gap is closed by an overflow of the electrolyte operated by pumps. This also enables access to workpieces with a rough or undulating or bent surface.

For the workpieces with a silicon coating, the workpiece itself can be chosen from any materials. The workpieces can thereby preferably have a thickness between 50 µm and 500 mm, the workpiece being able to be present both as a wafer or also as solid slabs. The workpiece, in particular made of silicon, is thereby preferably highly doped with a specific resistance below 0.1 Ωcm.

The device according to the invention hence allows a production method for porous silicon layers in which workpieces are etched electrochemically when passing through. The etching is thereby effected on one side and preferably over the entire surface. The device according to the invention can thereby be based on units which are used for one-sided processing of workpieces with high throughput rates, e.g. continuous electroplating plants.

A further important advantage of the device according to the invention is based on the fact that sealing elements on the workpiece can be entirely dispensed with, which allows simpler handling of the unit.

The device according to the invention thereby makes possible very homogeneous thick porous silicon layers since the inhomogeneities in the etching current density in the transport direction are compensated for since these inhomogeneities run through from each point of the workpiece and consequently are averaged out.

Preferably, a planar electrode or an electrode wire netting is used as cathode. However, it is likewise possible to use an individual electrode wire as cathode which is preferably disposed perpendicular to the transport direction. The material of the cathode thereby consists preferably of platinum, nickel alloys and/or glassy carbon.

The spacing of the cathode relative to the surface of the workpiece to be etched is thereby chosen preferably in the range of 1 to 500 mm, particularly preferably 10 to 100 mm.

The at least one anode is preferably configured as a sliding contact, rolling contact or movable contact synchronized with the movement of the workpiece. The material of the at least one anode is thereby preferably made of platinum, nickel alloys, corrosion-resistant stainless steel, titanium, aluminium, graphite and/or glassy carbon.

A further preferred embodiment provides that the contact unit of the at least one anode is purged with a protective gas. Preferably air or nitrogen is used here as protective gas. In this way, it is made possible that the exposed contact material does not come in contact with electrolyte vapours or reaction vapours. This variant is useful in particular when electrolytes with combustible components, e.g. combustible surfactants, are used.

The device according to the invention can preferably be coupled to other conditioning- or post-treatment units. Of concern hereby in particular are units for surface treatment, for rinsing or for drying. This can hereby concern in particular a currentless damage etch for surface preparation of the workpiece or ultrapure water rinsing units or drying units for post-treatment of the workpiece.

In a preferred embodiment, the device according to the invention is coupled to a further unit for thermal reorganisation of the porous silicon layer. Such a unit for thermal reorganisation preferably has a temperature- or power control for temperature-control of the workpiece. Likewise, it preferably comprises a device for producing a controlled gas atmosphere at least on the heated parts of the front-side. This can be produced for example by air locks. The unit for thermal reorganisation preferably has planar or focused lamps for adjusting the temperature required for the reorganisation in the porous silicon layer. The lamps are thereby preferably selected from the group of halogen lamps, LED lamps or semiconductor lasers.

In a further preferred embodiment of the method, the workpiece is a planar disc, in particular made of silicon, with a front-side and a rear-side and the transport device effects a horizontal transport of the planar disc, the surface to be etched being the front-side of the planar disc and the rear-side which is not in contact with the electrolyte being contacted electrically with the anode via the contact unit.

The transport device preferably concerns roller transport, air-/fluid cushion transport or sliding transport.

A further embodiment according to the invention provides that the workpiece is a cylinder, in particular a silicon ingot, and the transport device effects rotation of the cylinder, the surface to be etched being the outer surface area of the cylinder and the cylinder being contacted electrically with the anode via the contact unit on a surface not to be etched.

It is thereby preferred that the cathode has a concave surface, the curvature of the concave surface of the cathode being adapted to the curvature of the outer surface area of the cylinder such that the cathode has a uniform spacing relative to the outer surface area of the cylinder.

According to the invention, a method for continuous production of porous silicon layers on workpieces made of silicon or workpieces with a silicon coating by means of one-sided etching is likewise provided, in which at least one workpiece is guided, by means of at least one transport device, with the surface of the workpiece to be etched, past at least one etching chamber comprising an electrolyte and a cathode, only the surface to be etched being made wet with the electrolyte and the workpiece being contacted electrically with an anode via a contact unit on a surface not to be etched, as a result of which electrochemical etching of the surface is made possible.

Preferably, the etching chamber is disposed below the workpiece.

It is thereby preferred that the electrochemical etching is implemented with an etching current of 0.1 to 1,000 mA/cm$^2$, preferably of 5 to 500 mA/cm$^2$.

Preferably, when using more than one etching chamber, these are operated with etching currents of different magnitudes and/or different electrolyte mixtures in order to be able to produce multilayer systems with different porosities and thicknesses.

Furthermore, when using more than one etching chamber, these can preferably be operated with etching currents of equal magnitude and the same electrolyte mixtures in order to produce thicker layers or to increase the throughput of the unit.

The electrolyte preferably comprises hydrofluoric acid and at least one alcohol or a surfactant, in particular ethanol, acetonitrile, dimethylsulphoxide, dimethylacetamide, dimethylformamide, formamide, acetic acid and mixtures of surfactants, e.g. siloxanes and polyalkylene oxide copolymers. However, also further additives can be contained.

Preferably, convection of the electrolyte is effected in order to avoid formation of bubbles.

In a preferred embodiment of the method according to the invention, the workpieces are radiated with light in order to produce electron defects (holes), the light having a wavelength of 200 nm and 1,200 nm, particularly preferably between 400 and 1,100 nm. Preferably, the one-sided etching of the workpiece is effected over the entire surface.

The previously described device according to the invention is used for the production of photovoltaic cells or electrodes for Si—Li batteries or Si-air batteries.

The subject according to the invention is intended to be explained in more detail with reference to the subsequent Figures and examples, without wishing to restrict said subject to the specific embodiments shown here.

BRIEF DESCRIPTION OF DRAWINGS

FIG. 1 shows an embodiment of the state of the art: the etching unit consists of the electrolyte container 6, the cathode 2 and also the current source 1. The workpiece 3, typically a silicon wafer, is sealed for example on the etching unit by O-rings. The anode 4 contacts the workpiece, either directly via a solid body contact (e.g. platinum) or indirectly via a (not illustrated) further electrolyte container. For the production of the porous silicon layer, an etching current is impressed on the workpiece via the cathode 2 and the anode 4, the level and duration of which is adapted to the number of ply layers and to the porosity. For the production of a porous silicon double layer which can be detached after a reorganisation, e.g. the following parameters are suitable:

Layer 1 (low-porous layer, approx. 30% porosity): 10 mA/cm$^2$ etching current density, etching duration 60 sec, electrolyte 50% ethanol+50% hydrofluoric acid.

Layer 2 (highly-porous layer, approx. 60% porosity): 200 mA/cm$^2$ etching current density, etching duration 5 sec, electrolyte 50% ethanol+50% hydrofluoric acid.

Figure 1:
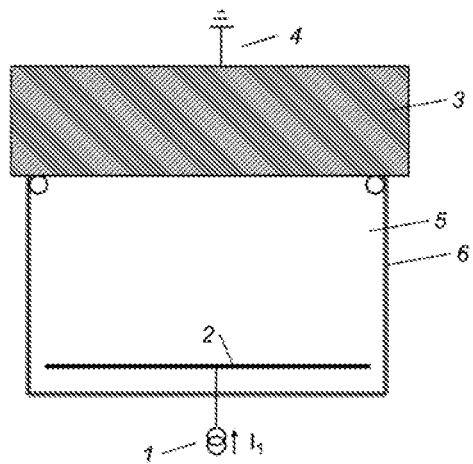
FIG. 1 shows an embodiment of the state of the art of an etching unit.
Figure 2:
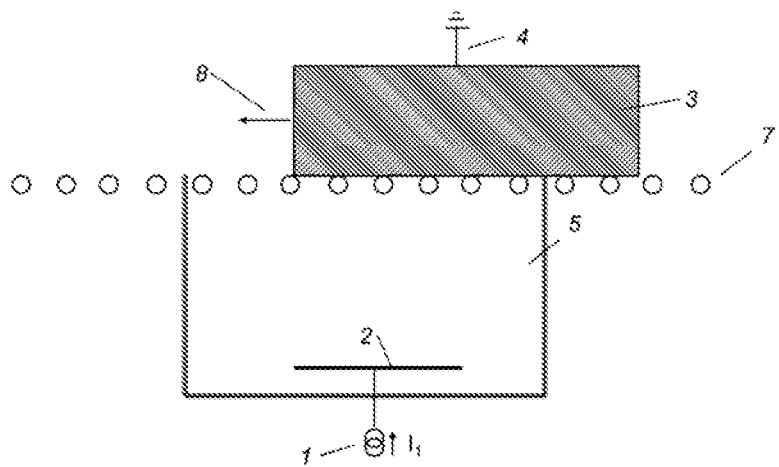
FIG. 2 shows an embodiment of the etcher according to the invention.

FIG. 2 shows the basic principle of the etcher according to the invention. The workpiece 3 is not connected to the etching unit in a sealed manner, but is mounted with a suitable transport device 7 such that it is in contact with the electrolyte. The anode contact 4 can be configured either to be fixed as a rotating/rolling contact or as a sliding contact. A possible protective gas purging device for avoiding an ignition source at the anode is not illustrated in FIG. 2. The etching process is implemented in the following manner:

An etching current is impressed on the workpiece via the cathode 2 and the anode 4. The liquid level of the electrolyte 5 is adjusted, e.g. via a suitable pump device, or via a defined immersion depth, such that the side of the workpiece to be etched is made wet with the electrolyte. Preferably, the electrolyte is moved so that hydrogen produced in the etching process is transported away from the surface to be etched. During the etching process, the workpiece is moved along the electrolyte in a direction 8 with the help of the transport device 7. By means of the movement, possible inhomogeneities in the transport direction are compensated for. The etching of multiple layers can be implemented by repeatedly passing over the etching unit, either after a return transport with a switched-off etching unit, or by a pendulum movement with the etching unit switched on. By varying the etching current per sequence, stacks of different layers can be produced. In order to avoid variations in the etching result when moving the workpiece in and out, the etching current can be adapted dynamically such that the etching current density acting on the workpiece remains constant at all times.

An etching process according to the invention can be implemented for example in the following manner:

The workpiece is prepared outside the etching unit and the voltage required for production of the etching current is applied to the electrodes. The workpiece is set in motion with the transport unit and is moved continuously over the etching unit. The surface contaminated by the electrolyte is thereafter decontaminated by rinsing in deionised water and dried for example with a fan or by the effect of e.g. infrared or microwave radiation.

Figure 3:
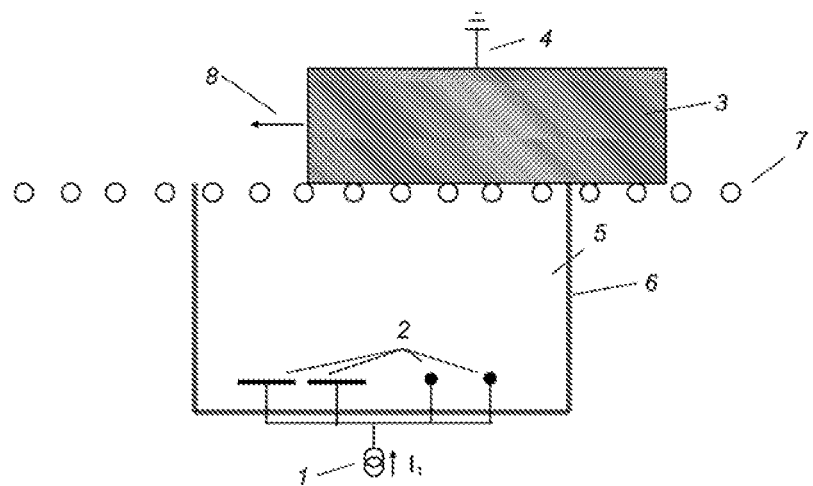
FIG. 3 shows an additional embodiment of the invention where the cathode is made of a plurality of individual cathodes that are connected electrically in parallel.

Suitable etching parameters are:

For a low-porous layer, approx. 30% porosity): 10 mA/cm$^2$ etching current density, active region of the electrodes in transport direction 60 cm, feed rate 60 cm/min, electrolyte 50% ethanol+50% hydrofluoric acid For a highly-porous layer, approx. 60% porosity): 200 mA/cm$^2$ etching current density, active region of the electrodes in transport direction 5 cm, feed rate 60 cm/min, electrolyte 50% ethanol+50% hydrofluoric acid FIG. 3 shows a further device according to the invention: instead of a planar cathode, the cathode is disposed here made of a plurality of individual cathodes 2 which are connected electrically in parallel. In general, the individual cathodes are extended along over the width of the workpiece perpendicular to the transport direction in order to ensure a homogeneous etching rate relative to the transport direction.

Figure 4:
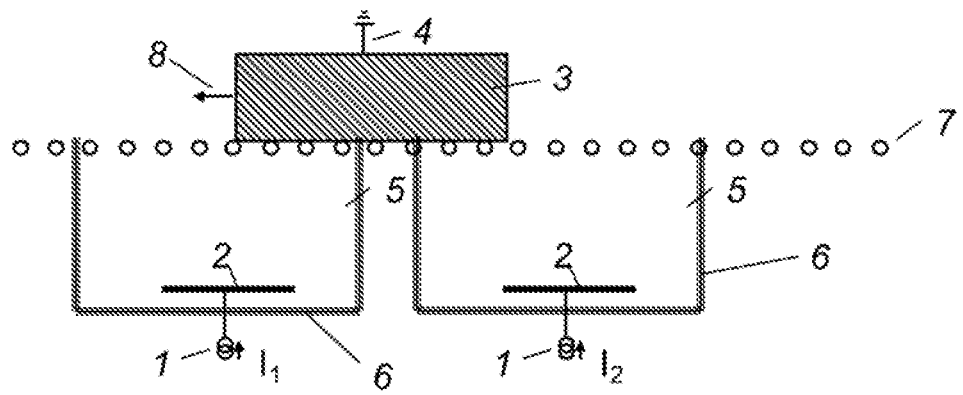
FIG. 4 shows an alternative embodiment of the invention with a plurality of etching units that are connected sequentially in succession.

FIG. 4 shows a form of the device according to the invention with a plurality of etching units (1, 2, 5, 6) which are connected sequentially in succession. The individual etching units can be operated independently of each other so that layers of different porosity and thickness can be produced in one pass.

An etching process for production of a double-ply layer, which is detachable, for example after a thermal treatment in hydrogen, can be implemented in the following manner:

The workpiece is prepared outside the etching unit and the voltage required for production of the etching current is applied to the electrodes both of the first and of the second etching unit. The workpiece is set in motion with the transport unit and moved over the etching units continuously. The surface contaminated by the electrolyte is thereafter decontaminated by rinsing in deionised water, and e.g. dried with a fan or by the effect of e.g. infrared or microwave radiation. Suitable etching parameters are:

Etching chamber 1 (for a low-porous layer, approx. 30% porosity): 10 mA/cm$^2$ etching current density, active region of the electrodes in transport direction 60 cm, feed rate 60 cm/min, electrolyte 50% ethanol+50% hydrofluoric acid Etching chamber 2 (for a high-porous layer, approx. 60% porosity): 200 mA/cm$^2$ etching current density, active region of the electrodes in transport direction 5 cm, feed rate 60 cm/min, electrolyte 50% ethanol+50% hydrofluoric acid As in the case of the method according to the invention with an etching unit, here also the layer properties can be kept constant by varying the etching current when moving in and out, or multiple layers respectively of the same or different properties can be produced by a pendulum movement over both etching units.

Likewise, the throughput of the device with the same layer thickness can be increased by the multiple arrangement of etching units with the same etching parameters or the layer can be produced to be thicker with the same throughput.

For these purposes, the device according to the invention can also be equipped with more than two etching units e.g. for producing optical Bragg reflectors with e.g. 16 units.

Figure 5:
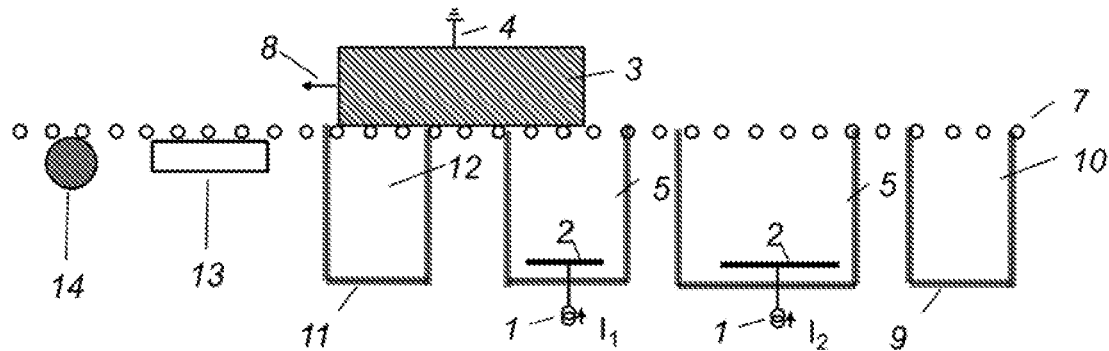
FIG. 5 shows another embodiment of the invention with functional units mounted in front and behind the etching units.

FIG. 5 shows a preferred extension of the device according to the invention with functional units mounted in front and behind the etching units. For example a unit 9 for the cleaning etch of the workpiece is disposed in front of the etching units (1, 2, 5, 6) in transport direction, and also a rinsing unit 11 which operates for example with deionised water for decontamination of the workpiece after the etching units in transport direction, a drying and reorganisation unit 13 for drying the workpiece and for reorganisation of the porous silicon multilayer and also a further unit 14 for detaching the thin silicon layer. A corresponding process can be implemented in the following manner:

The cleaning unit 9 is filled with a polishing silicon etch, for example a mixture of nitric acid, hydrofluoric acid and deionised water, and operated with a pump in the overflow. If necessary, a rinsing device with deionised water can be connected subsequent to the silicon etch so that the workpiece, when entering into the subsequent porous silicon etching units, has a clean surface.

The rinsing device 11 can be configured as spray rinsing unit with deionised water. The drying and detachment unit 13 can be equipped, for example with a heating unit based on halogen lamps or quartz radiators. For production of a reducing atmosphere, the unit can provide a purging device with hydrogen-containing gas (e.g. 5% hydrogen in argon or 100% hydrogen), for example by air locks, which are known from the state of the art, being disposed at the beginning and end of the unit 13 and which separate the external atmosphere from the reducing atmosphere present in the unit 13. The detachment unit is equipped with a low pressure of e.g. 100 mbar on the segment orientated towards the workpiece and rotates at the same circumferential speed as the transport speed 8.

The workpiece is firstly transported over the cleaning unit 9, any crystal damage possibly present or residues of the preceding process being removed. The workpiece is decontaminated in the integrated rinsing device with deionised water. By passing over the etching units (1, 2, 5, 6), which are operated for example with the parameters of the device described under FIG. 4, a detachment layer is produced. The contaminated workpiece is guided over the rinsing unit 11 and decontaminated by spraying with deionised water. The wet workpiece is dried firstly by air-/gas flow and the effect of heat in the continuous feed in the drying and reorganisation unit. At high temperature, the porous silicon layer is reorganised and consequently the detachment capacity is produced. When passing over the detachment unit, the layer is detached from the workpiece by mechanical effect, e.g. by suctioning with low pressure, and is supplied for a suitable further treatment (not shown in FIG. 5, e.g. rolling up, glueing on a carrier substrate, depositing on electrostatic temporary substrates . . . ). The workpiece can thereupon be transported back again to the initial point and supplied once again to the process.

Possible process parameters for this process are:

Transport speed 8: 60 cm/min

Contact length of the cleaning unit 9: 100 cm, produces e.g. an etching time of 40 s Contact length of the rinsing unit 11: 40 cm, produces a rinsing time of 40 s Drying and reorganisation unit: contact length 240 cm, of which respectively 60 cm heating/cooling zone and 120 cm reorganisation zone, produces a heating time of 1 min, a reorganisation time of 2 min, a cooling time of 1 min. Temperature in the reorganisation zone 1,200° C. (measured in the porous silicon layer), atmosphere in the heated region 100% hydrogen.

Figure 6:
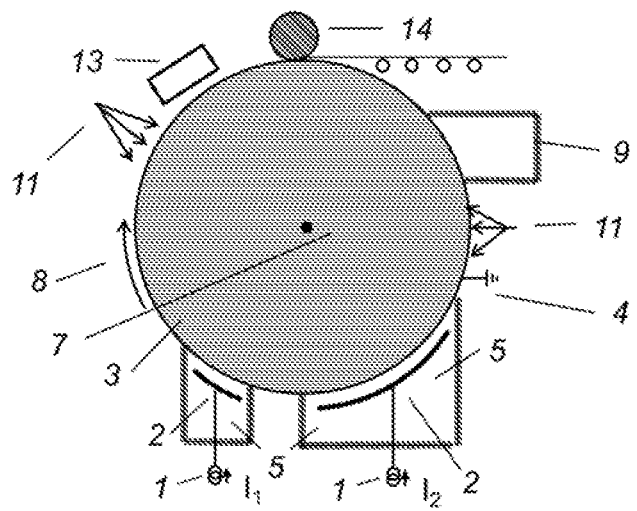
FIG. 6 shows another embodiment of the invention with a cylindrical, rotating workpiece that is fitted with functional units mounted in front and behind.

FIG. 6 shows, as further preferred form, a device according to the invention with a cylindrical, rotating workpiece which is fitted with functional units mounted in front and behind. The workpiece 3, e.g. a cylindrical silicon monocrystal, is mounted such that it can rotate about its longitudinal axis. The anode 4 is configured such that it leaves no damage behind on the surface of the crystal which can impair the porous silicon layer. It can be configured, e.g. as sliding contact on the end-faces of the crystal, as rolling contact on the circumferential face or as jointly rotating or sliding contact in a boring along the longitudinal axis of the crystal. The etching units are disposed along the circumferential face of the crystal, by means of suitable overflow- or sealing elements the electrolyte is brought in contact in a defined manner with the crystal surface/circumferential surface. In the transport/rotation direction 8 there follows a rinsing unit 11 (e.g. configured as spray rinsing unit with suction) for decontamination, and also a drying and reorganisation unit 13 for drying and reorganisation of the porous silicon layer. The reorganised layer can be detached continuously, e.g. by mechanical effect, with a detachment unit 14. With an etching and rinsing unit 10 disposed after the detachment unit 14 in transport direction, the surface of the workpiece can be conditioned for the silicon etching process.

Changes in the crystal diameter can be compensated for by adaptive electrode spacings and adaptation of the spacings of the functional units including etching units.

A method which is possible with this device can be implemented in the following manner:

A silicon cylinder which is ground precisely on the surface as uniformly as possible, e.g. to 0.01 mm, and is free of crystal damage serves as workpiece which comprises a boring in the centre and in which an axis for mechanical mounting and also as anode contact is inserted. The porous silicon etching units are filled with electrolyte and are operated with a pump in the overflow. The rinsing devices 11, the drying and reorganisation unit 13 and the detachment unit 14 are operated with their parameters. The etching unit 10 is ready for filling with a polishing silicon etch, it is operated in the overflow in the process.

The crystal is set in motion by the transport device 8 at a circumferential speed of 20 cm/min, at the same time the etching currents are activated. In the etching units, a porous double-ply layer is produced, which is decontaminated in the rinsing unit with further continuous rotation and is dried and reorganised in the drying and reorganisation unit 13. With the detachment unit 14, the layer is detached by mechanical effect and supplied for further use. As soon as the transition region of the crystal surface between the native crystal surface and the residues of the porous silicon layer arrive at the conditioning unit 10, this is filled and consequently the crystal surface is reconditioned for further etching. Subsequently, the crystal surface is decontaminated in the rinsing device 11 between the conditioning unit 10 and the first etching unit 6. With permanent rotation, a quasi-endless band of crystalline silicon can be detached.

Possible process parameters for this process are:
Transport speed 8 (circumferential speed): 20 cm/min
Contact length of the cleaning unit 9: 10 cm, produces an etching time of 30 s
Contact length of the rinsing units 11: 10 cm, produces a rinsing time of 30 s
Drying and reorganisation unit: contact length 20 cm, produces a process time of 1 min. Temperature in the reorganisation zone 1,200° C. (measured in the porous silicon layer), atmosphere in the heated region 100% hydrogen
Etching chamber 1 (for a low-porous layer, approx. 30% porosity): 10 mA/cm$^2$ etching current density, active region of the electrodes in transport direction 20 cm, electrolyte 50% ethanol+50% hydrofluoric acid
Etching chamber 2 (for a highly-porous layer, approx. 60% porosity): 200 mA/cm$^2$ etching current density, active region of the electrodes in transport direction 2 cm, electrolyte 50% ethanol+50% hydrofluoric acid.

LIST OF REFERENCE SYMBOLS IN THE FIGURES

1: Current source/cathode contact
2: Cathode
3: Silicon workpiece
4: Anode/anode contact
5: Electrolyte
6: Etching container
7: Transport unit
8: Transport direction
9: Etching tank
10: Conditioning etch
11: Rinsing unit
12: Deionised water—spraying-/or overflow rinsing unit
13: Drying and reorganisation unit
14: Detachment unit

The invention claimed is:

1. A method for continuous production of porous silicon layers on workpieces made of silicon or workpieces with a silicon coating by one-sided etching, comprising the steps of:
   guiding at least one workpiece, by at least one transport device, with the surface of the workpiece to be etched, past more than one etching chamber comprising an electrolyte and a cathode, the more than one etching chamber being disposed below the workpiece, the more than one etching chamber comprises a first etching chamber and a second etching chamber that are arranged one after the other along a transport direction of the at least one workpiece such that the at least one workpiece is guided first past the first etching chamber and subsequently past the second etching chamber,
   electrochemically etching the surface where only the surface to be etched being made wet with the electrolyte, and the workpiece being contacted electrically with an anode via a contact unit on a surface not to be etched,
   optionally operating the etching chambers of the more than one etching chamber with different electrolyte mixtures in order to able to produce multilayer systems with different porosities and thicknesses by the electrochemical etching of the surface, and
   moving the electrolyte so that hydrogen produced in the etching process is transported away from the surface to be etched, thus effecting convection of the electrolyte.

2. Method according to claim 1, wherein the electrochemical etching is implemented with an etching current of 0.1 to 1,000 mA/cm$^2$.

3. Method according to claim 1, wherein the electrolyte comprises hydrofluoric acid and at least one alcohol or a surfactant, including ethanol, acetonitride, dimethylsulphoxide, dimethylacetamide, dimethylformamide, formamide, acetic acid, mixtures of surfactants, e.g. siloxanes and polyalkylene oxide copolymers.

4. Method according to claim 1,
wherein the workpiece made of silicon or the workpiece with a silicon coating is radiated with light in order to produce electron defects ("holes"), the light having a wavelength between 200 nm and 1,200 nm.

5. Method according to claim 1,
wherein the workpiece is a planar disc, including a silicon disc with a thickness of 50 μm to 500 mm, with a front-side and a rear-side and transport of the planar disc is effected horizontally, the front-side of the planar disc being etched and the planar disc being contacted electrically with the anode via the contact unit in a region not to be etched.

6. Method according to claim 1,
wherein the workpiece is a cylinder, including a silicon ingot, and the transport device effects rotation of the cylinder, the surface to be etched being the outer surface area of the cylinder and the cylinder being contacted electrically with the anode via the contact unit on a surface not to be etched.

7. Method according to claim 1,
wherein a device according to claim 1 is used.

* * * * *